(12) United States Patent
Jin

(10) Patent No.: US 6,218,077 B1
(45) Date of Patent: Apr. 17, 2001

(54) METHOD OF MANUFACTURING AN INTEGRATED CIRCUIT USING A SCANNING SYSTEM AND A SCANNING SYSTEM

(75) Inventor: Feng Jin, Orange, FL (US)

(73) Assignee: Agere Systems Guardian Corp., Miami Lakes, FL ( * ) Notice: Subject to any disclaimer, the term of this patent is extended or adjusted under 35 U.S.C. 154(b) by 0 days.

(21) Appl. No.: 09/178,720

(22) Filed: Oct. 26, 1998

(51) Int. Cl.[7] ............................. G03F 7/22; G03F 7/207
(52) U.S. Cl. .......................................... 430/311; 430/397
(58) Field of Search ............................... 430/311, 322, 430/394, 396, 397

(56) References Cited

FOREIGN PATENT DOCUMENTS

04214612 * 8/1992 (JP) .
4-214612 * 8/1992 (JP) ............................. H01L/21/027

OTHER PUBLICATIONS

"A New Method For Enhaning Focus Latitude In Optical Lithography: FLEX", H. Fukuda et al., *IEEE Electron Device Letters*, vol. EDL–8, No. 4, Apr. 1987.

"Improvement Of Defocus Tolerance In A Half–Micron Optical Lithography By The Focus Latitude Enhancement Exposure Method: Stimulation And Experiment," H. Fukuda et al., J. Vac. Sci. Technol., B7 (4), Jul./Aug. 1989.

* cited by examiner

Primary Examiner—Kathleen Duda
(74) Attorney, Agent, or Firm—Anthony Grillo

(57) ABSTRACT

A method of manufacturing an integrated circuit using an imaging system having a mask and an energy source that produces an exposure field. A substrate is moved across the exposure field while changing the depth of focus of the imaging system relative to the substrate. The depth of focus may be changed by moving the substrate, the mask, or both, relative to each other changes the depth of focus. The depth of focus may be oscillated according to a periodic waveform where the waveform is equal to the time for a typical point on the substrate to pass through the exposure field.

12 Claims, 3 Drawing Sheets t = t3
Z = 0.5 t = T
Z = 0 t = T + t1
Z = 0.5

NORMALIZED MOVEMENT

METHOD OF MANUFACTURING AN INTEGRATED CIRCUIT USING A SCANNING SYSTEM AND A SCANNING SYSTEM

FIELD OF THE INVENTION

The present invention relates generally to manufacturing an integrated circuit and, more particularly, to a method of manufacturing integrated circuits using scanning systems and methods.

BACKGROUND OF THE INVENTION

Integrated circuit (IC) fabrication involves a process sequence in which patterns are generated in different material layers using, for example, a combination of deposition, lithography, and etching techniques. After the formation of a material layer on a silicon wafer, lithographic and etching techniques are used to transfer a desired pattern into the material, or to process the exposed substrate material. Typically, a radiation-sensitive material, called a resist, is spin-coated onto this material layer prior to lithographic printing. The lithographic printing step is usually performed using an imaging tool called a stepper, which has a high intensity light source, a relay lens, a reticle stage, an imaging lens and a high precision translation stage.

A reticle containing an IC pattern to be printed is illuminated by the high intensity light source, which may be a mercury arc lamp or a laser, at a specific wavelength that causes radiation-induced changes in the resist. The light passing through the reticle is imaged by the lens onto the resist layer on the wafer. After each exposure, the wafer is stepped by a translation stage to the next site for subsequent exposure. The wafer is positioned on the translation stage. This exposure step essentially generates a latent image of the circuit pattern in the resist, similar to the exposure of a photographic film in conventional photography. The exposed resist can then be developed to produce a patterned resist layer, which can be used as a mask in a subsequent processing step, which, for example, transfers this pattern onto the underlying material layer.

The pattern is formed using a thin layer of material opaque to the radiation. The opaque material may be a chrome layer formed on a quartz substrate. During the exposure step, illuminating light passes through the reticle at regions where chrome, the pattern material, is absent. The light that passes through the reticle travels through a lens to expose the resist on the substrate. The opaque material prevents light from passing through the reticle.

The resolution R of an optical system and the depth of focus DOF at its resolution limit are respectively expressed in equations (1) and (2) below.

$$R = k_1 \frac{\lambda}{NA} \quad (1)$$

$$DOF = k_2 \frac{\lambda}{(NA)^2} \quad (2)$$

$\lambda$ is the wavelength, NA is the numerical aperture of the projection optical system, and $k_1$ and $k_2$ are process dependent constants.

There is an increasing demand to shrink transistor size and increase circuit speed. One method of reducing transistor size is to enhance the resolution of the optical system by reducing the wavelength $\lambda$ and increasing the numerical aperture NA. Changing these parameters reduces the depth of focus DOF. For example, a typical deep ultraviolet (DUV) stepper having a wavelength $\lambda$ equal to 0.248 µm and a numerical aperture NA equal to 0.6 has a resolution R of approximately 0.3 µm and a depth of focus DOF of approximately 0.5 µm. This assumes $k_1=k_2=0.8$. Transferring the pattern from the reticle to the substrate becomes more difficult as the depth of focus decreases.

Efforts have been made to increase the effective depth of focus DOF. One such method is the focus latitude enhancement exposure process, also known as focus drilling. This method is described in A new method for enhancing focus latitude in optical lithography: Flex, *IEEE Electron Device Letters*, EDL-8, 179, (1987) by H. Fukuda et al.; and Using multiple focal planes to enhance depth of focus, SPIE 1674, Optical/Laser Microlithography V, 285, (1992) by C. A. Spence et al. Each of these documents are herein incorporated by reference.

During focus drilling, the same part of the wafer is exposed at different focal positions. This is achieved by moving the wafer stage in the Z direction while the stepper shutter is open. The image on the wafer is, therefore, an integration of multi-exposures at different focal positions. This method was developed for stepper tools having wafer stages, which did not perform X-, or Y-movement while the shutter is open. In other words, the wafer stage is in a fixed position in the X or Y-direction relative to the light source when the relative position of the substrate stage is changed in the Z direction.

Current lithography tools, however, are transitioning to scanner systems for critical level printing. In a scanner system, the reticle translation stage (the platform holding the reticle) and the substrate translation stage (the platform holding the substrate) are at constant motion when the shutter is open. As described above, the prior art technique uses a wafer stage that is maintained in a fixed position during exposure. Therefore, it would be difficult to implement the prior art focus drilling technique directly in a scanner system. Thus, it would be desirable to provide a system that improves the effective depth of focus DOF for present and future lithography technologies.

SUMMARY OF THE INVENTION

The present invention provides a method of manufacturing an integrated circuit using an imaging system having a mask (a reticle) and an energy source that produces an exposure field. A substrate is moved across the exposure field while changing the depth of focus of the imaging system relative to the substrate. The depth of focus may be changed by moving the substrate, the mask, or both, relative to each other changes the depth of focus. The depth of focus may be oscillated according to a periodic waveform where the waveform is equal to the time for a typical point on the substrate to pass through the exposure field. It is to be understood that both the foregoing description and the following detailed description are exemplary, but are not restrictive, of the invention.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
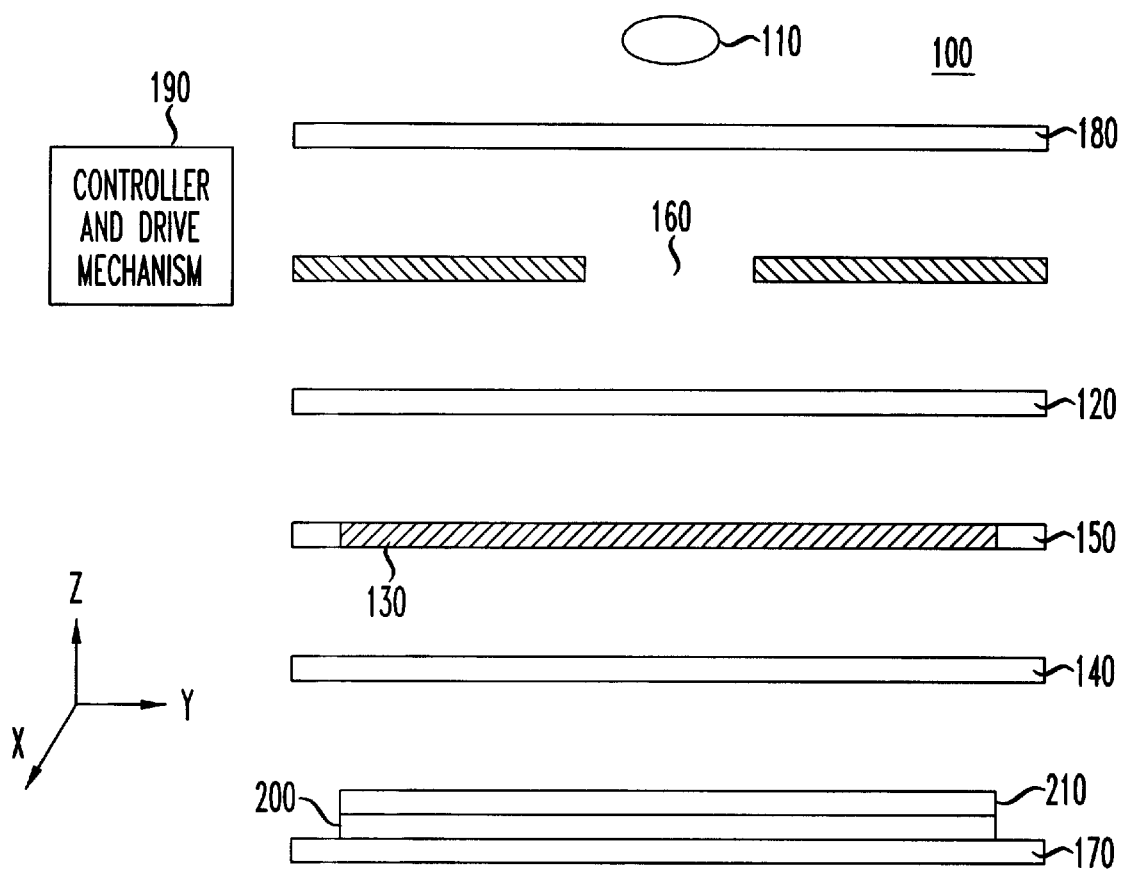
FIG. 1 is a schematic diagram of a scanning system according to an illustrative embodiment of the present invention.

Referring now to the drawing, wherein like reference numerals refer to like elements throughout, FIG. 1 is a schematic diagram of a scanning system 100 according to an illustrative embodiment of the present invention. The scanning system 100 includes a high intensity light or energy source 110, a condenser lens 180, a relay lens 120, an imaging lens 140, and a reticle translation stage 150 including a reticle 130. The resist 210 on the substrate 200 is exposed to the energy source 110 through a slit 160 which limits the area of the resist exposed by the energy source 110 through the reticle 130.

During the exposure operation, both the reticle 130 and the substrate 200 are constantly moving when the resist 210 is exposed to the energy source 110. The reticle translation stage 150 moves the reticle 130 in one or more directions and the substrate translation stage 170 moves the substrate 200 in one or more directions. For example, the reticle translation stage 150 and the substrate translation stage 170 may respectively move the reticle 130 and the substrate 200 parallel to the x-y plane. Typically, the reticle translation stage 150 is moved relative to the substrate translation stage 170 in a straight line (the scanning direction) parallel to the X-Y plane.

The distance between the imaging lens 130 and the substrate 200 is adjusted in the z-direction in an oscillatory fashion around a desired focal plane by moving the substrate translation stage 170. Movement of the reticle translation stage 150, translation stage 170, and other components is implemented by controller and drive mechanism 190. In an alternative embodiment, the imaging lens 140, reticle translation stage 150, or other component may be adjusted or moved to change the DOF. An exemplary scanning system is S203 or S202 produced by Nikon Inc.

Figure 2:
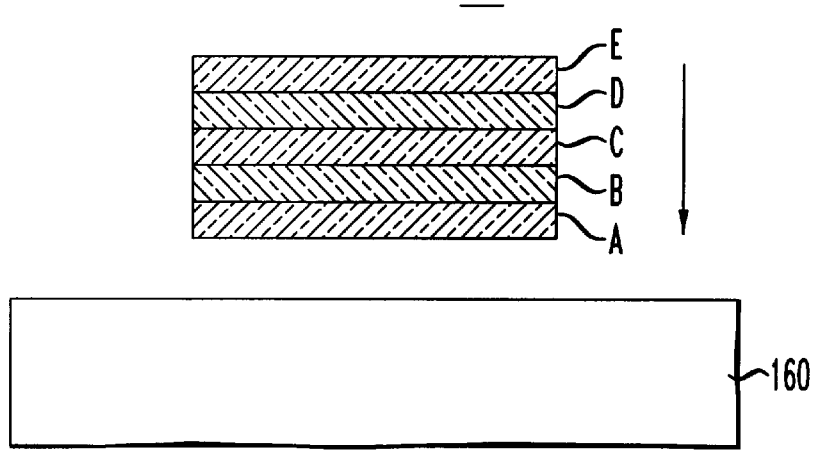
FIG. 2 is a top view of the scanning system of FIG. 1.
Figure 3A:
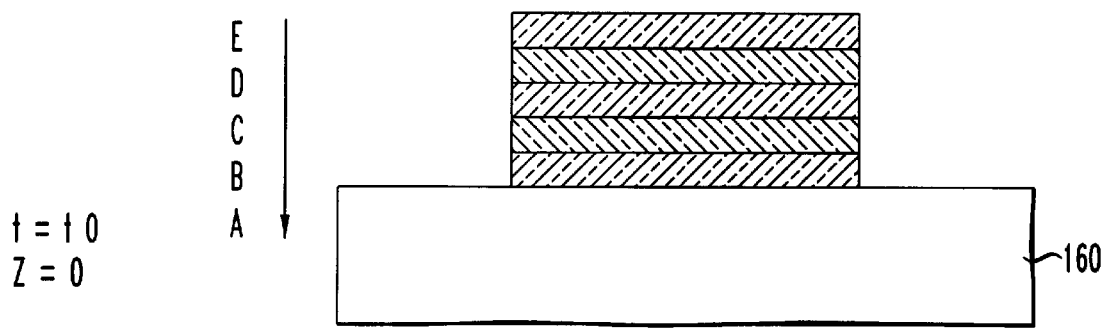
FIGS. 3a–3f are top views of the scanning system of FIG. 1 during successive stages of operation.
Figure 3B:
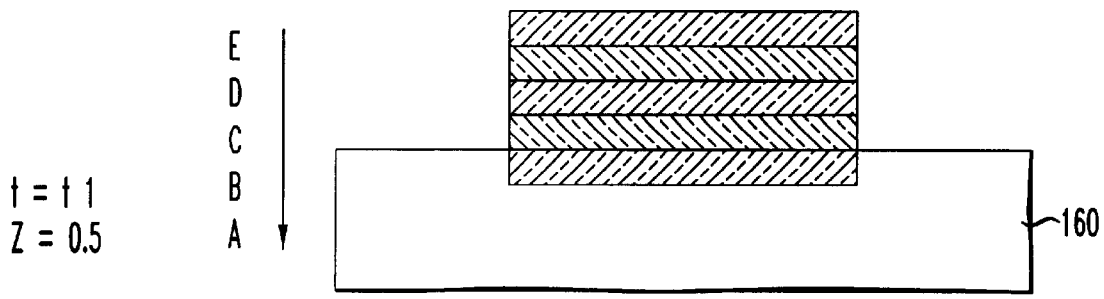
Figure 3C:
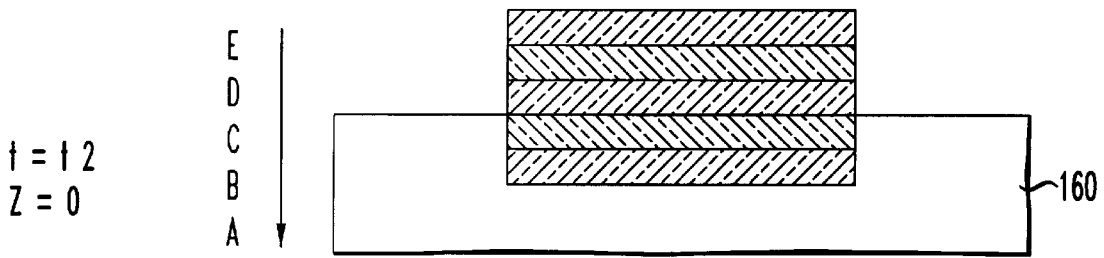
Figure 3D:
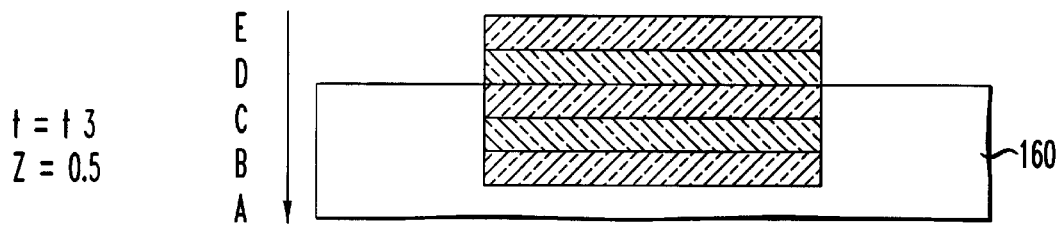
Figure 3E:
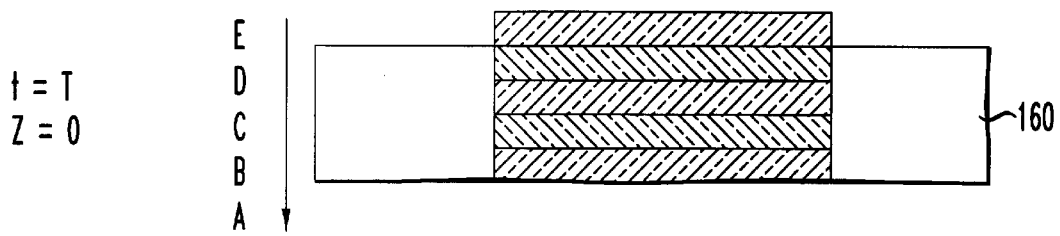
Figure 3F:
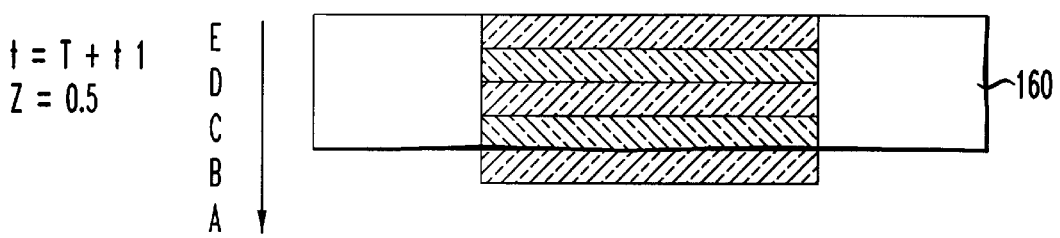

The operation of the scanning system 100 is described below with reference to FIGS. 2–4 and continuing reference to FIG. 1. FIG. 2 is a top view of the scanning system 100 and an image field 300 to be imaged on the substrate 200 using an exposure field defined by the slit 160. Other components of the scanning system 100 are not shown for clarity. FIGS. 3a to 3f illustrates the exposure of the imaging field 300 at different times.

The period of movement of the substrate translation stage 170 (or other component) in the z-direction may be equal to the duration of time for each point in the image field 300 to pass under the slit 160 (or through the exposure field). In other words, the substrate translation stage 170 is moved through a periodic movement having a period T while the image field 300 passes under the slit 160 (or through the exposure field). The period T is equal to the time t that it takes a point in the image field 300 to pass under the slit 160 (through the exposure field). Each point in the image field 300 is exposed at the full range of the focal positions although each point within the image field 300 may start to enter the exposure field at a different phase of oscillation of the substrate translation stage 170.

For a scanner system with a scanning speed of 80 mm/sec and a slit width of 8 mm, for example, the time needed for any point to pass through the image field is 0.1 second. Thus, the period T for the substrate translation stage 170 motion is 0.1 second. In other words, the period of time for the substrate translation stage 170 to move through its range of motion and return to its starting position is equal to the period of time for a point in the image field 300 to pass through the exposure field. FIG. 4 shows the movement of the image field 300 relative to the movement of the substrate translation stage 170 according to a sinusoidal waveform.

Returning to FIGS. 3a–3f, lines A through E represent positions in the imaging field along a line in the scan direction in that field. At time t0, line A enters the slit when the substrate translation stage 170 is at a position to produce a desired DOF or optimal DOF. This position is identified as Z equals zero (Z=0). Z is a normalized number where Z equals zero (Z=0) is the center of the substrate translation stage 170 movement and where Z equals ±1 (Z=±1) corresponds to the full range of movement of the substrate translation stage 170 relative to the reticle translation stage 150 in the Z-direction. At time t1, after a quarter period (1/4 T), the line A is passing under the slit and the line B starts to pass under the slit while the stage is at a top location of Z=1. The lines C, D, and E follow one after another in order, passing under the slit while line A moves further towards the other edge of the slit and the substrate translation stage 170 moves down and up. At time t=T, the substrate translation stage 170 has undergone the full cycle of movement in the Z-direction back to the Z=0 position, at substantially the same time or at the same time that the line A passes through the entire slit.

Each line in the image field will experience the same route as line A except that they may enter the slit while the stage is at different positions in the Z direction. Because the image field passes under the slit continuously, it is not necessary to setup a starting position for the Z motion (motion in the Z-direction) relative to the X or Y motion (motion in the scanning direction). The two motions should be implemented so that the period of the Z motion is equal to the time for a point to pass from one end of the slit to the other end of the slit. The period of motion may be continuously implemented.

A typical range of Z motion may be about ±0.5 $\mu$m. This motion may be implemented using a piezoelectric-driven mechanism in the controller and drive mechanism 190. The process described above may be implemented in hardware or software or a combination thereof. For example, the controller and drive mechanism 190 may include a processor that controls mechanical and/or moving the different components.

Figure 4:
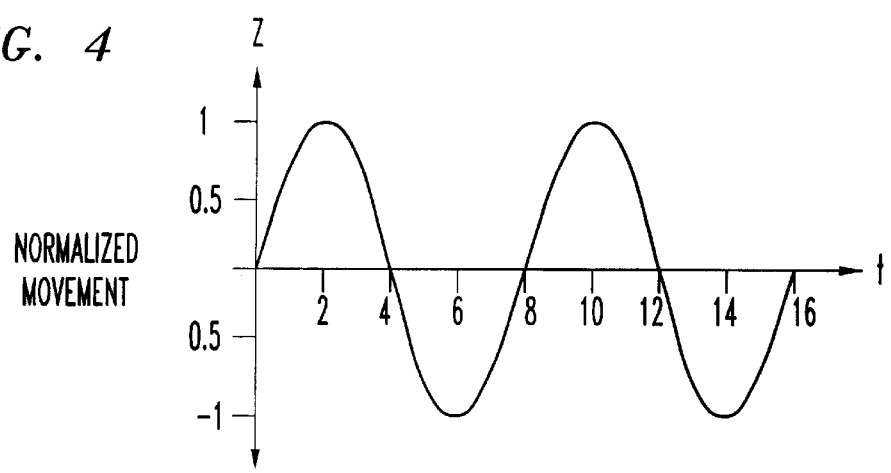
FIG. 4 is a waveform diagram illustrating the movement of the substrate translation stage with respect to the reticle of the scanning system of FIG. 1.

FIG. 4 illustrates the sinusoidal movement of the substrate translation stage 170 in the Z-direction with reference to lines A through E as they pass under the slit. Although the movement is shown to be sinusoidal, different functions or waveforms having periodic form may characterize the movement of the substrate translation stage 170. For example, a periodic triangular waveform having a periodic movement may be used to define the motion of the translation stage. In addition, the frequency of the substrate translation stage 170 oscillation may be increased. The frequency of the translation stage 170 oscillation is defined in equation (3) below.

$$f = \frac{n}{T} \quad (3)$$

n is an integer and T is the period of time for a point in the image field to pass from one edge to another edge of the slit 160 (or through the exposure field).

Using the process described above, the DOF may be doubled. The doubling of the DOF by this method may also alleviate the stringent requirement of exact focus tracking during the scan, which may increase the throughput of the scanner system. Although movement in the Z-direction of the substrate translation stage was described above for increasing the DOF, other components may be moved or adjusted to change the DOF. For example, the reticle 130 may be moved in the z-direction in an oscillatory fashion to change the DOF. Alternatively, more than one component may be moved or adjusted to change the DOF. For example, the substrate translation stage and the reticle may both be moved.

Although the invention has been described with reference to exemplary embodiments, it is not limited to those embodiments. Rather, the appended claims should be construed to include other variants and embodiments of the invention which may be made by those skilled in the art without departing from the true spirit and scope of the present invention.

What is claimed:

1. A method of manufacturing an integrated circuit comprising:
    (a) exposing a substrate to an energy source while moving the substrate in a first direction, the substrate exposed at a depth of focus; and
    (b) changing, during exposure, the depth of focus while moving the substrate in a second direction different from the first direction.
2. The method of claim 1 further comprising
    positioning the substrate on a stage; and
    moving the substrate in the second direction by moving the stage.
3. The method according to claim 1 further comprising oscillating the depth of focus.
4. The method according to claim 3 further comprising oscillating the depth of focus (DOF) between a first DOF and a second DOF.
5. The method according to claim 3 further comprising oscillating the depth of focus according to a sinusoidal waveform.
6. The method according to claim 3 further comprising oscillating the depth of focus according to a periodic waveform.
7. The method according to claim 1 further comprising oscillating the depth of focus at a frequency of f where:

$$f = \frac{n}{T}$$

and n is an integer other than zero and T is a period of time for the depth of focus to oscillate between a first depth of focus and a second depth of focus.

8. The method according to claim 7 further comprising:
    exposing the substrate using an exposure field; and
    moving a position on the substrate from one end of the exposure field to another end of the exposure field during the period T.
9. The method according to claim 1 further comprising oscillating the depth of focus (DOF) from an initial DOF through a first DOF and a second DOF returning to the initial DOF where the first DOF is a maximum DOF, the second DOF is a minimum DOF, and the initial DOF is between the first DOF and the second DOF.
10. A method for manufacturing an integrated circuit comprising:
    (a) providing a substrate having an image field;
    (b) producing an exposure field;
    (c) moving the image field in a first direction under the exposure field at a depth of focus; and
    (d) moving the image field in a second direction to change the depth of focus from a first depth of focus to a second depth of focus, the first direction being different than the second direction.
11. The method according to claim 10 wherein steps (c) and (d) are performed at substantially the same time.
12. The process according to claim 10 wherein the exposure field has a first edge and a second edge and the process further comprises:
    moving the image field in the first direction under the exposure field from the first edge to the second edge during a period of T; and
    oscillating the depth of focus between a maximum and a minimum depth of focus during the period T.

* * * * *